(12) United States Patent
Chatterjee et al.

(10) Patent No.: US 6,287,920 B1
(45) Date of Patent: Sep. 11, 2001

(54) METHOD OF MAKING MULTIPLE THRESHOLD VOLTAGE INTEGRATED OF CIRCUIT TRANSISTORS

(75) Inventors: Amitava Chatterjee, Plano; Mahalingam Nandakumar, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/640,485

(22) Filed: Aug. 16, 2000

Related U.S. Application Data

(60) Provisional application No. 60/152,654, filed on Sep. 7, 1999.

(51) Int. Cl.⁷ .............................................. H01L 21/8236
(52) U.S. Cl. ........................ 438/276; 438/291; 438/302
(58) Field of Search .................................. 438/275, 276, 438/289, 291, 302, 305, 525

(56) References Cited

U.S. PATENT DOCUMENTS

| | | | |
|---|---|---|---|
| 5,432,107 | * 7/1995 | Uno et al. | 438/276 |
| 5,830,788 | * 11/1998 | Hiroki et al. | 438/302 |
| 5,834,347 | * 11/1998 | Fukatsu et al. | 438/302 |
| 6,022,778 | * 2/2000 | Contiero et al. | 438/302 |

FOREIGN PATENT DOCUMENTS 4-329632 * 11/1992 (JP).

* cited by examiner

*Primary Examiner*—Chandra Chaudhari
(74) *Attorney, Agent, or Firm*—Peter K. McLarty; W. James Brady, III; Frederick J. Telecky, Jr.

(57) ABSTRACT

A method for forming multiple threshold voltage integrated circuit transistors. Angled pocket type implants (80) are performed to form asymmetric regions (90) and (95). The source and drain regions (120, 121, 122, and 123) are connected such that multiple threshold voltage transistors are formed.

5 Claims, 3 Drawing Sheets

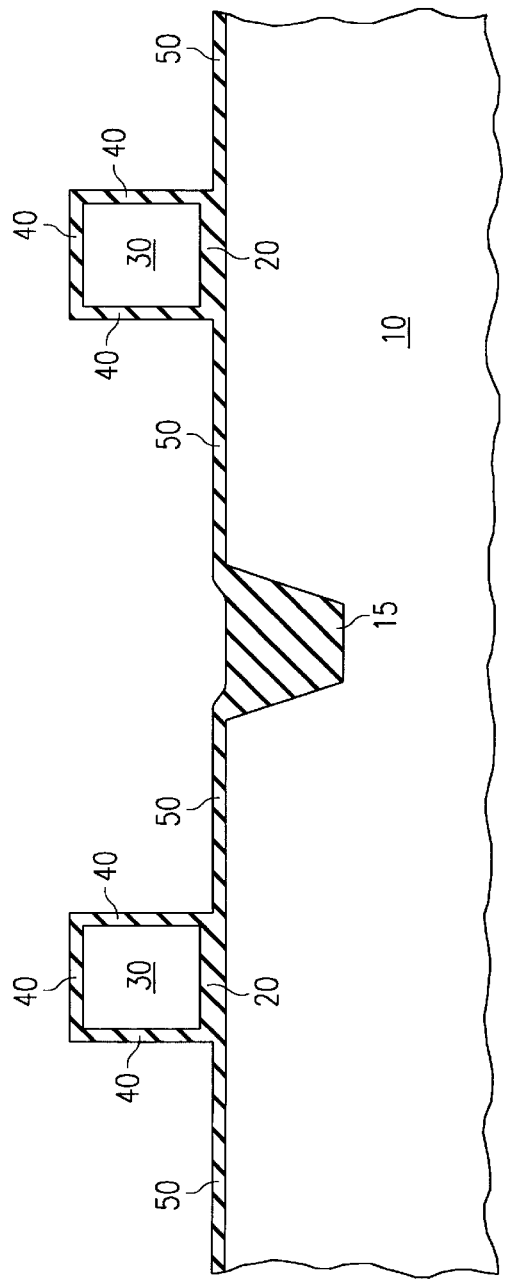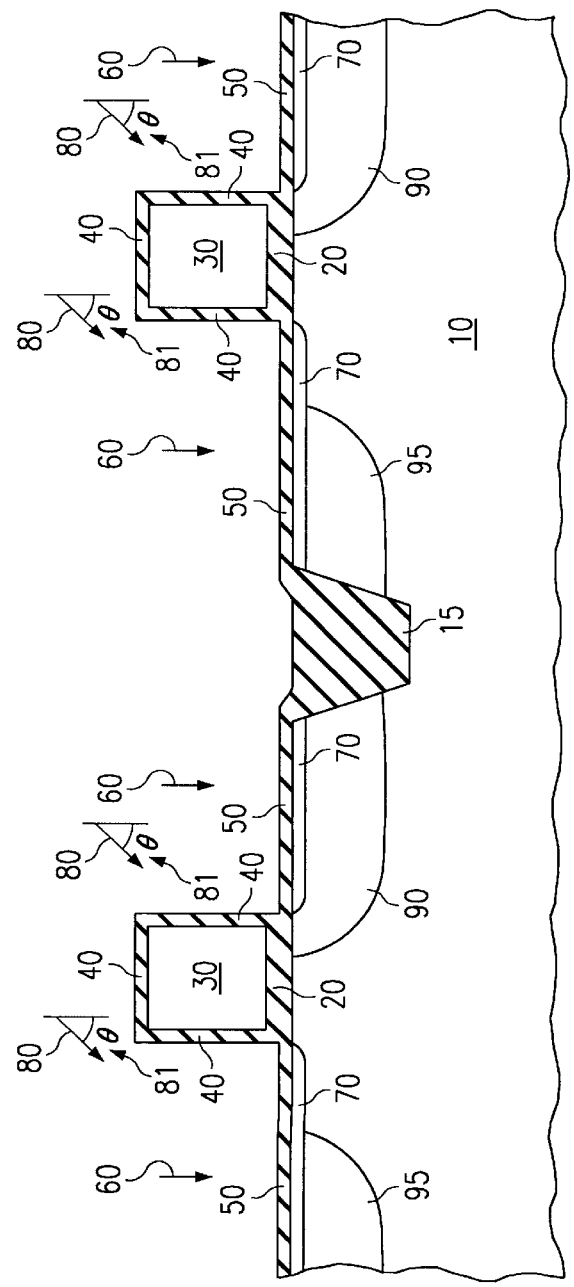
FIG. 1A
FIG. 1B

METHOD OF MAKING MULTIPLE THRESHOLD VOLTAGE INTEGRATED OF CIRCUIT TRANSISTORS

This application claims benefit of Provisional No. 60/152,654 filed Sep. 7, 1999.

FIELD OF THE INVENTION

The invention is generally related to the field of MOSFET transistors and more specifically to a novel process to achieve multiple threshold voltage integrated circuit transistors.

BACKGROUND OF THE INVENTION

It is often necessary to have transistors with differing threshold voltages on the same integrated circuit. This is mainly used in mixed signal applications but can be used in any integrated circuit application. Currently, a number of implants are performed during transistor fabrication to control the transistor threshold voltage. For the fabrication of integrated circuits containing multiple threshold voltage transistors, this methodology requires multiple photolithography masking steps for each transistor. This adds tremendous cost to the fabrication process as photolithography masking steps are among the most costly processes. There is therefore a great need in the fabrication of integrated circuits for a method to form reliable high performance multiple threshold voltage integrated circuits with a reduction in number of photolithography masking steps over existing methods.

SUMMARY OF THE INVENTION

The instant invention is method for forming multiple threshold voltage transistors on integrated circuits with reduced masks. An embodiment of the invention comprises the steps of: providing a semiconductor substrate region of a first conductivity type; forming a gate dielectric film on said semiconductor substrate region; forming a conductive layer on said gate dielectric; etching said conductive layer to form at least two gate structures over said semiconductor region; implanting said semiconductor region adjacent to said gate structures with a first dopant species of a second conductivity type to form drain extension regions; implanting said semiconductor region adjacent to said gate structures with an angled implant of a second dopant species of a first conductivity type such that said second dopant species impinge on a first side of said gate structures and are shadowed from impinging on a second side of said gate structures said second side of said gate structures being opposite said first side of said gate structures; forming sidewall structures adjacent said first side of said gate structures and said second side of said gate structures; implanting said semiconductor regions adjacent to said sidewall structures with a third dopant species of a second conductivity type to form source and drain regions for at least two transistors; and interconnecting said source and drain regions such that on a first transistor the source region is adjacent to said first side of said gate structure and the drain region is adjacent to said second side of said gate structure and on a second transistor the source region is adjacent to said second side of said gate structure and the drain region is adjacent to said first side of said gate structure.

An advantage of the instant invention is that no masking steps are required for forming the multiple threshold voltage integrated circuits. This and other advantages will be apparent to those of ordinary skill in the art having reference to the specification in conjunction with the drawings.

BRIEF DESCRIPTION OF THE DRAWINGS

In the drawings:

FIGS. 1A–1D are cross-sectional diagrams at various steps in the fabrication of multiple threshold voltage transistors on an integrated circuit for a particular embodiment of the instant invention.

Figure 1C:
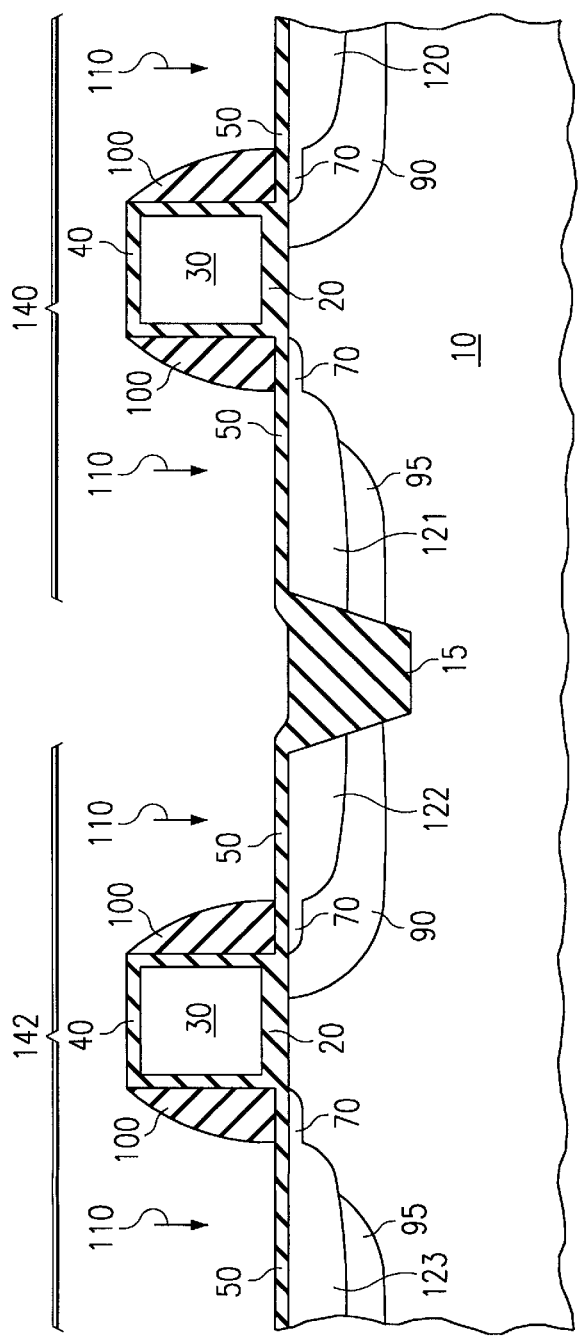

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1A–1D and FIG. 2, the instant invention can be utilized in any semiconductor device structure. The methodology of the instant invention provides a solution to obtain reliable high performance multiple threshold voltage integrated circuits with a reduction in number of photolithography masking steps.

Referring to FIG. 1A, a region of a semiconductor substrate 10 is provided and a gate dielectric 20 is formed on this substrate region 10. The substrate region 10 can be of n-type or p-type conductivity type and can be part of the semiconductor bulk or an epitaxial layer. The semiconductor region 10 could also be part of a well region in the semiconductor substrate of the type used in the twin well process. The twin well process is well known in the art of integrated circuit fabrication. The gate dielectric 20 may be comprised of an oxide, thermally grown SiO2, a nitride, an oxynitride, or any combination thereof, and is preferably on the order of 1 to 10 nm thick. A layer of silicon containing material (which will be patterned and etched to form gate structure 30) is formed on gate dielectric 20. Preferably, this silicon-containing material is comprised of polycrystalline silicon ("poly" or "polysilicon"), but it may be comprised of epitaxial silicon or any other semiconducting material. Contained in the substrate will be isolation structures 15. These isolation structures may comprise an oxide or some other insulator. The purpose of the isolation structure 15 is to isolate the actives devices from one another on the substrate. This isolation structure 15 can comprise shallow trench isolation structures (STI) or local oxidation (LOCOS) both of which are well known in the art. Following the formation of the gate structure 30, spacer structures 40 are formed on the gate structure 30. Preferably, this spacer structure 40 is comprised of silicon dioxide which can formed by thermal growth, film deposition, or a combination of both processes. The insulator film 50 over the surface of the substrate 10 can be formed simultaneously with the spacer 40 formation processes. The insulator film 50 is used to protect the surface of the substrate 10 during the subsequent implantation processes used during transistor fabrication.

Shown in FIG. 1B is the structure of FIG. 1A after drain extension implants and angled pocket or halo implants. The drain extension implant 60 is zero degree implant which is self aligned to the spacer structure 40. The drain extension implant 60 results in the formation of drain and source extension regions 70 illustrated in FIG. 1B. For a p-type substrate region 10, n-type dopant species are implanted 60 which can comprise arsenic, phosphorous, or a combination of both. For a n-type substrate region 10, p-type dopant species are implanted 60 which can comprise a boron containing ion. Following the formation of the source and drain extension regions 70, an angled pocket or halo implant is performed 80. This angled implant produces the asymmetric pocket or halo regions 90 and 95 shown in FIG. 1B. For the direction of the angled implant shown in FIG. 1G, a portion of region 90 will exist under the gate structure 30 while region 95 will form far from the gate structure 30. The formation of 90 and 95 is a result of the shadowing of the angled implant 80 by the gate structure 30 and the spacer structure 40. The angle φ of the implant should be between about 15° to about 55° as shown in FIG. 1B by 81. For a n-type substrate region 10, n-type dopant species are implanted 80 which can comprise arsenic, phosphorous, or a combination of both. For a p-type substrate region 10, p-type dopant species are implanted 80 which can comprise a boron containing ion.

Shown in FIG. 1C is the structure of FIG. 1C after the formation of the sidewall structures 100 and the source and drain regions 120, 121, 122, and 123. In an embodiment of the instant invention these sidewall structures 100 can be formed with silicon nitride using a blanket film formation followed by an anisotropic silicon nitride etch. Such a process is well known in the art. Following the formation of the sidewall structures 100, the source region and drain regions 120, 121, 122, and 123 are formed using a source drain ion implantation process 110. For a n-type substrate region 10, a p-type dopant species such as a boron containing ion species is used to form the source drain regions 120, 121, 122, and 123. For a p-type substrate region 10, n-type dopant species such as arsenic, phosphorous, a combination of both, or any suitable n-type dopant ion species is used to form regions 120, 121, 122, and 123. Following formation of the source drain regions 120, 121, 122, and 123, and the drain and source extension regions 70 a thermal annealing process is performed to thermally activate the implanted dopants. If it is necessary to form a silicide film on the source and drain junction regions 120, 121, 122, and 123, it should preferably be performed after the anneal of the source and drain implanted regions.

For the transistor 140 shown in FIG. 1C, region 120 will function as the drain of the transistor and region 121 will function as the source of the transistor. The threshold voltage of a MOS transistor is a function of the doping in the substrate region directly under the gate structure. In addition, the threshold voltage of the transistor is more sensitive to doping in the substrate region adjacent to the source of the transistor than it is to doping in the substrate region adjacent to the drain of the transistor. With reference to transistor 140 in FIG. 1C, the relationship of the source region 121 and the drain region 120 to the proximity of the asymmetric pocket regions 90 and 95 to the substrate region beneath the gate structure will determine a particular threshold voltage VT1 for transistor 140. For transistor 142, region 122 will function as the source of the transistor and region 123 will function as the drain of the transistor. Given the new relationship of the source region 122 and the drain region 123 to the proximity of the asymmetric pocket regions 90 and 95 to the substrate region beneath the gate structure for this transistor 142, transistor 142 will have a new threshold voltage VT2 which will be greater than VT1. Transistors 140 and 142 define multiple threshold voltage transistors fabricated as part of an integrated circuit without the addition of extra masking steps.

Figure 2:
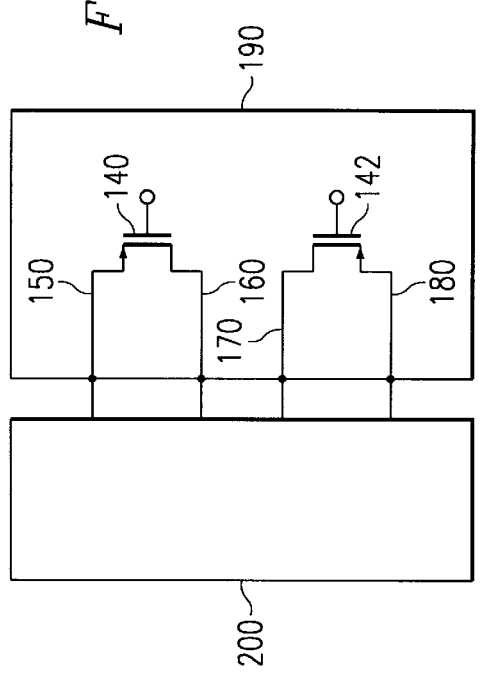
FIG. 2 is a schematic diagram showing the connecting of integrated circuit asymmetric transistors to an external circuit.
Figure 1D:
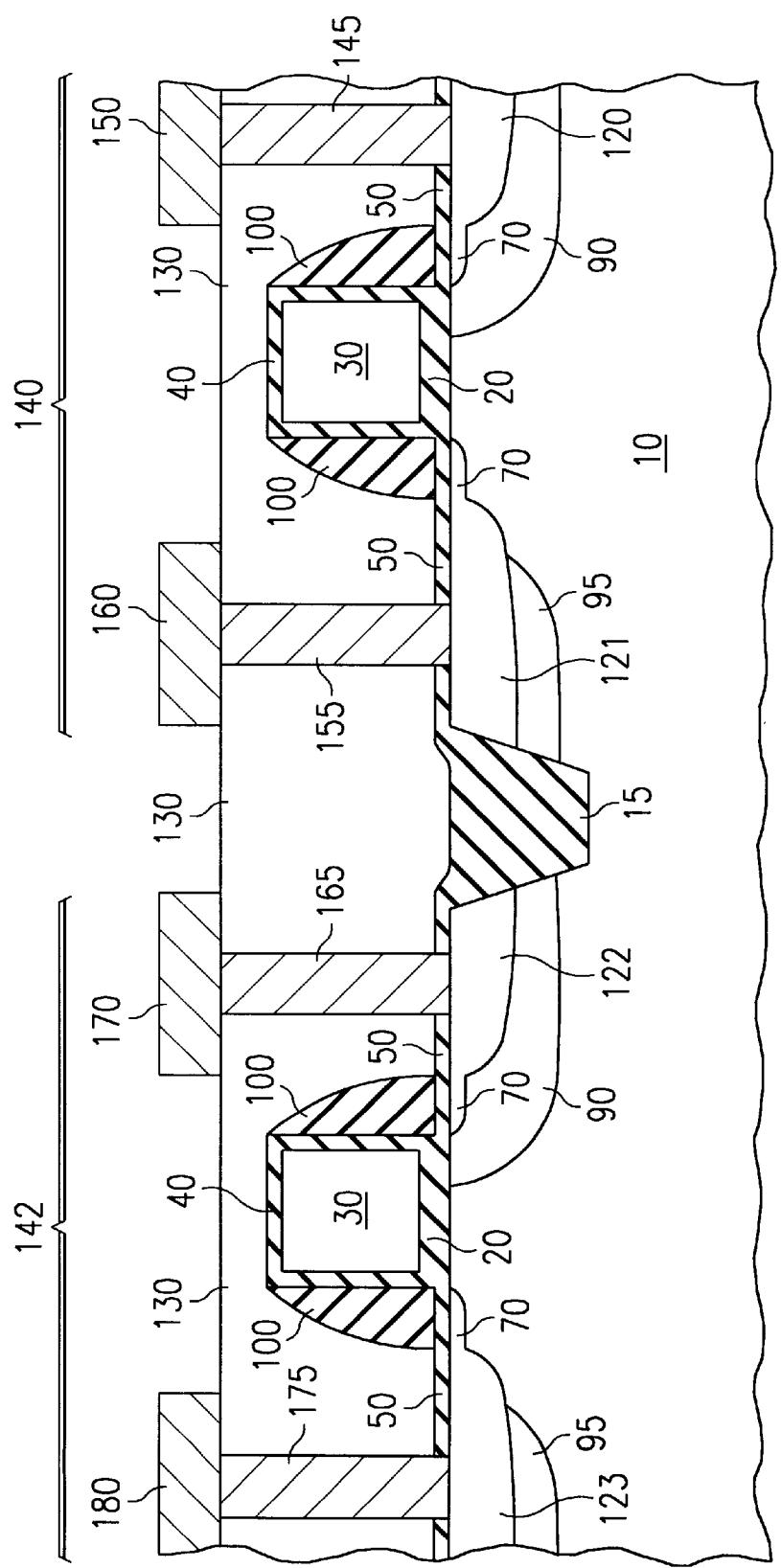

Shown in FIG. 1D is the structure of FIG. 1C after the formation of conductive contacts 150, 160, 170, and 180 to the source and drain regions 120, 121, 122, and 123 of the various transistors. An insulator film is formed over the substrate region 10 and planarized to form the planar insulator film 30. In an embodiment of the instant invention, this planar insulator film 30 comprises silicon oxide, BPSG, or PSG which was planarized using chemical mechanical polishing (CMP). Contact holes are formed in the insulator film 30 to expose a portion of the source and drain regions 120, 121, 122, and 123 of the transistors 140 and 142. Conducting material is formed in the various contact holes 145, 155, 165, and 175 to contact the surface of the various source and drain region 120, 121, 122, and 123. In an embodiment of the instant invention this conducting material can comprise tungsten or aluminum, titanium nitride, or a combination of these and other materials. Conducting lines 150, 160, 170, and 180 are formed on the insulator film 130 to provide electrical contact to the source and drain regions of the transistors 104 and 142 either to other devices on the integrated circuit or to devices and circuits external to the integrated circuit. In an embodiment of the instant invention, these conducting lines 150, 160, 170, and 180 can be formed using aluminum by first forming a blanket aluminum film followed by patterning and etching process steps. If it is required that transistors 140 and 142 be connected to external circuitry, line 150 will form the required connection for the drain terminal of transistor 140, line 160 will form the required connection for the source terminal of transistor 140, line 170 will form the required connection for the source terminal of transistor 102 and line 180 will form the required connection for the drain terminal of transistor 142. A schematic diagram representing the above connection for a n-type substrate region 10 is illustrated in FIG. 2. Here transistors 140, and 142 are shown as part of the integrated circuit chip 190 connected to an external circuit represented by 200.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating a multiple threshold voltage integrated circuit, comprising the steps of:

providing a semiconductor substrate region of a first conductivity type;

forming a gate dielectric film on said semiconductor substrate region;

forming a conductive layer on said gate dielectric;

etching said conductive layer to form at least two gate structures over said semiconductor region;

implanting said semiconductor region adjacent to said gate structures with a first dopant species of a second conductivity type to form drain extension regions;

implanting said semiconductor region adjacent to said gate structures with an angled implant of a second dopant species of a first conductivity type such that said second dopant species impinge on a first side of said gate structures and are shadowed from impinging on a second side of said gate structures said second side of said gate structures being opposite said first side of said gate structures;

forming sidewall structures adjacent said first side of said gate structures and said second side of said gate structures;

implanting said semiconductor regions adjacent to said sidewall structures with a third dopant species of a second conductivity type to form source and drain regions for at least two transistors; and interconnecting said source and drain regions such that on a first transistor the source region is adjacent to said first side of said gate structure and the drain region is adjacent to said second side of said gate structure and on a second transistor the source region is adjacent to said second side of said gate structure and the drain region is adjacent to said first side of said gate structure.

2. The method of claim 1, wherein said gate dielectric is comprised of a material selected from the group consisting of: silicon dioxide, silicon oxynitride, silicon nitride, and any combination thereof.

3. The method of claim 1, wherein said conductive layer is comprised of a material selected from the group consisting of: doped polysilicon, undoped polysilicon, epitaxial silicon, and any combination thereof.

4. The method of claim 1 wherein said interconnecting of said source and drain regions of said first transistor provides a first threshold voltage and said interconnecting of said source and drain regions of said second transistor provides a second threshold voltage such that said first threshold voltage is greater than said second threshold voltage.

5. The method of claim 1 wherein said angled implant of a second dopant species of a first conductivity type has an implant angle between 15° and 55° to a plane perpendicular to the substrate region.

* * * * *